(12) United States Patent
Lee et al.

(10) Patent No.: US 6,527,859 B2
(45) Date of Patent: Mar. 4, 2003

(54) APPARATUS FOR GROWING A SINGLE CRYSTALLINE INGOT

(75) Inventors: Hong-Woo Lee, Gumi-Shi (KR); Joon-Young Choi, Kyongsangbuk-do (KR); Hyon-Jong Cho, Bucheon-shi (KR); Hak-Do Yoo, Seoul (KR)

(73) Assignee: Siltron Inc., Guni-shi (KR)

( * ) Notice: Subject to any disclaimer, the term of this patent is extended or adjusted under 35 U.S.C. 154(b) by 0 days.

(21) Appl. No.: 09/920,808

(22) Filed: Aug. 3, 2001

(65) Prior Publication Data

US 2002/0096109 A1 Jul. 25, 2002

(30) Foreign Application Priority Data

Nov. 27, 2000 (KR) .......................................... 2000-71000

(51) Int. Cl.$^7$ .............................................. C30B 35/00
(52) U.S. Cl. ....................................................... 117/217
(58) Field of Search ................................. 117/208, 217, 117/218, 222

(56) References Cited

U.S. PATENT DOCUMENTS

| | | | | |
|---|---|---|---|---|
| 5,968,264 A | * | 10/1999 | Iida et al. | 117/30 |
| 6,036,776 A | * | 3/2000 | Kotooka et al. | 117/217 |
| 6,261,364 B1 | * | 7/2001 | Arai et al. | 117/213 |
| 6,364,947 B1 | * | 4/2002 | Iida et al. | 117/206 |
| 6,379,460 B1 | * | 4/2002 | Harada et al. | 117/217 |

* cited by examiner

Primary Examiner—Felisa Hiteshew
(74) Attorney, Agent, or Firm—Jacobson Holman PLLC (57) ABSTRACT

A chamber with a quartz crucible established therein for growing a single crystalline ingot with a predetermined diameter D which is to be put in the crucible. The quartz crucible is wrapped in a crucible supporter fixed to a rotational axis, with a heater surrounding the crucible support and a thermos surrounding the heater to prevent heat radiated from the heater from propagating into a wall of the chamber. A thermal shield is included which has a first cylindrical shielding part installed between the ingot and the crucible, a second flange type shielding part connected to an upper part of the first shielding part, and a third shielding part connected to a lower part of the first shielding part and protruding toward the ingot.

26 Claims, 6 Drawing Sheets

APPARATUS FOR GROWING A SINGLE CRYSTALLINE INGOT

BACKGROUND OF THE INVENTION

1. Field of Invention

The present invention relates to an apparatus for growing a single crystalline ingot like a round-pillar type that enables the growth of liquid state silicon into the single crystalline state.

2. Discussion of Related Art

A silicon wafer for the fabrication of various electronic devices such as semiconductors and the like is provided by thinly slicing a single crystalline silicon ingot. A single crystalline silicon ingot is fabricated by melting polycrystalline silicon into a liquid state and then by growing a crystal by the Czochralski method (hereinafter abbreviated as the Cz method) or the like.

As the defect characteristics inside an ingot depend on the sensitivity of the growing and cooling conditions of a crystal, efforts have been made to control the species and distributions of crystal growing defects by controlling the thermal environment near a crystal growing interface.

As the melted-down silicon is solid-crystallized, point defects of a vacancy type and an interstitial type are engaged over equilibrium concentration so as to develop into grown crystal defects. The Voronkov theory introduced in "The Mechanism of Swirl Defects Formation in Silicon" (Journal of Crystal Growth 59 (1982), pp. 625) by V. V. Voronkov teaches that such defect formation is closely related to a V/G ratio, where V is a pulling rate of an ingot and G is an axial temperature gradient near the crystal growing interface.

Based on the Voronkov theory, a vacancy type defect occurs when the V/G ratio exceeds a critical value, while an interstitial type defect occurs when the V/G ratio is lower than the critical value. Therefore, the pulling rate has an influence on the species, sizes, and density of the defects existing in the crystal when a crystal is grown according to a given growing environment of a predetermined hot zone.

Generally, the axial temperature gradient G increases radially from the center of the ingot to the edge. Thus, the vacancy type crystal defect region tends to occur at the center of the ingot, while the interstitial type crystal defect occurs most frequently at the circumference. Such defects are observed as COP (crystal originated particle), LDP (large dislocation pit), OSF (oxidation-induced stacking fault) or the like, at a surface of the wafer after predetermined treatments thereon such as etching, heat-treatment, and the like.

Accordingly, in order to restrict the generation of the vacancy type crystal defects at the center thereof when growing the crystal, as well as the interstitial type crystal defects at the circumference, an axial temperature gradient deviation $\Delta G$, i.e., the difference between the axial temperature gradient $Gc$ of the central part of the single crystalline ingot and the axial temperature gradient $Ge$ of the circumferential part of the single crystalline ingot, in the radial direction of the crystal on the single crystalline ingot, should be reduced and an average axial temperature at the growth interface improved.

In order to reduce the axial temperature gradient deviation $\Delta G$ in the radial direction of the crystal in the single crystalline ingot, the axial temperature gradient $Gc$ should be increased or the axial temperature gradient $Ge$ at the circumferential part should be decreased.

However, the average axial temperature gradient of the growth interface of the single crystalline ingot is reduced when the axial temperature gradient deviation $\Delta G$ is decreased by reducing the axial temperature gradient $Ge$ of the circumferential part, thereby reducing the growth rate of the single crystalline ingot.

Accordingly, efforts have been made to develop an apparatus for growing a single crystalline ingot that will reduce the generation of crystal defects and improve the growth rate, more particularly, to a thermal shield having a direct effect on the thermal environment at the growth interface.

Figure 1:
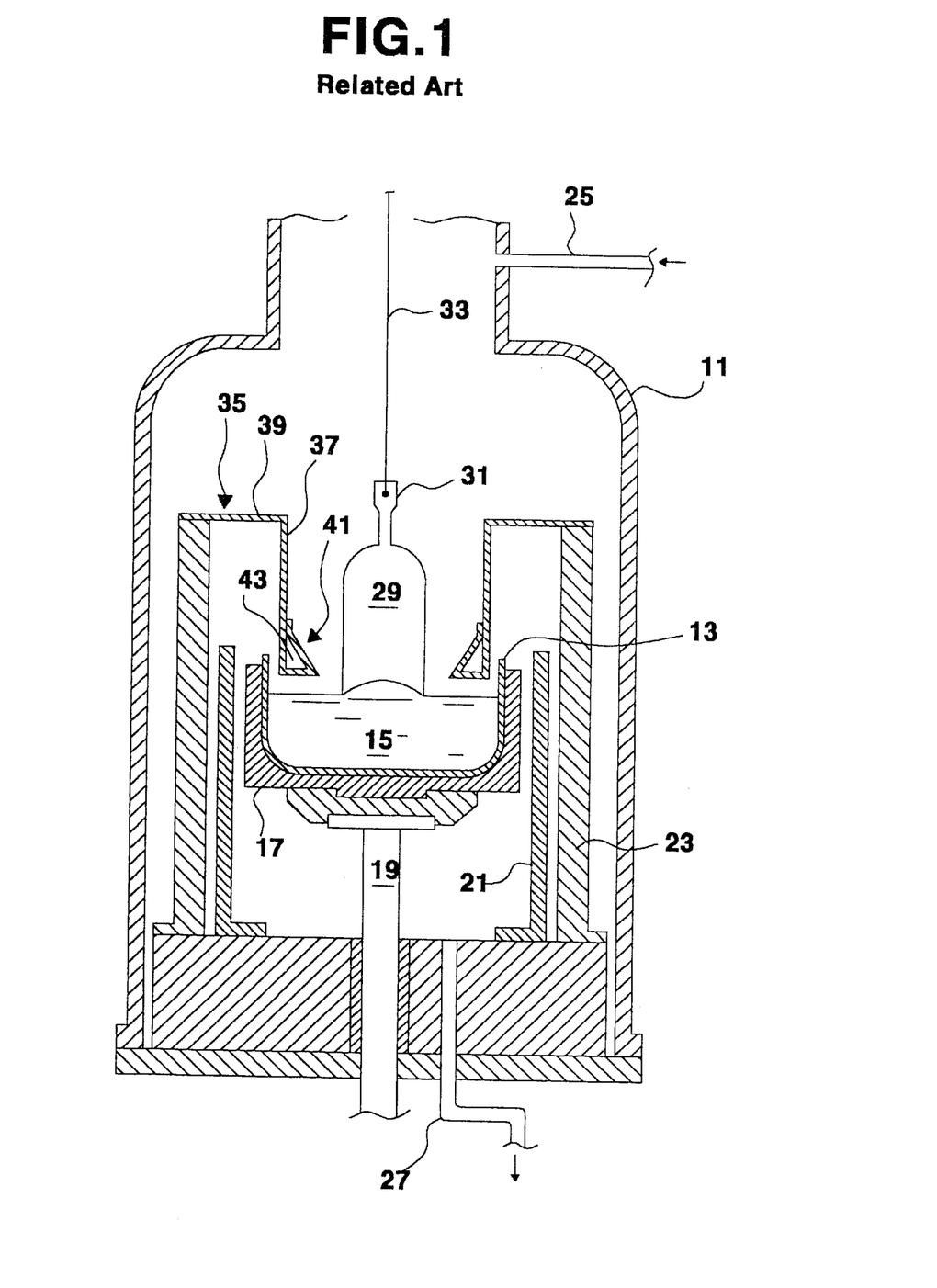
FIG. 1 shows a schematic cross-sectional view of an apparatus for growing a single crystalline ingot according to a related art.

FIG. 1 shows a schematic cross-sectional view of an apparatus for growing a single crystalline ingot according to a related art. Referring to FIG. 1, a quartz crucible 13 containing a meltdown silicon 15 is installed in a chamber of an apparatus for growing a single crystalline ingot. The quartz crucible 13 is coated with a crucible support 17, the surface of which is made of graphite. The crucible support 17 is fixed on a rotational axis 19, which is rotated by a driving means (not shown in the drawing), thereby rotating the quartz crucible 13 to be driven upward.

The support 17 wrapping the quartz crucible 13 is surrounded at a predetermined interval by a cylindrical heater 21 which is surrounded by a thermos 23. In this case, the meltdown silicon 15 is provided by melting a polysilicon lump of high purity in the quartz crucible 13 using the heater 21.

At the upper part of the chamber 11, a pulling means (not shown in the drawing) for pulling an object by winding a cable 33 is installed, wherein the pulling means is rotational. At a lower part of the cable 33, a seed crystal 31 for growing a single crystalline ingot 29 by being pulled up while being contacted with the meltdown silicon 15 is set therein.

At the upper part of the chamber 11, a supply pipe 25 is established for supplying the growing single crystalline ingot 29 and the meltdown silicon 15 inside the crucible 13 with inert gas from the outside. At the lower part of the chamber 11, an exhaust pipe 27 exhausting the used inert gas outside is established.

A thermal shield 35 consisting of first, second and third shielding parts 37, 39 and 41 and surrounding the single crystalline ingot 29 is installed between the growing single crystalline ingot 29 and the crucible 13. In this case, the first shielding part 37 has a cylindrical shape which cuts off radiant heat from the heater 21, the second shielding part 39 has a flange figure connected to an upper part of the first shielding part 37 and is fixed to the thermos 23, and the third shielding part 41 is connected to a lower part of the first shielding part 37 and has a triangular cross-section that protrudes toward the single crystalline ingot 29.

In addition, a bottom of the third shielding part 41 is separated from the meltdown silicon horizontally by a predetermined interval to prevent the radiant heat generated from the meltdown silicon 15 from being transferred to the upper part of the chamber 11 so as to accumulate the heat near the growth interface of the single crystalline ingot 29. Thus, the temperature difference between the circumferential and central parts of the ingot is reduced near the growth interface, thereby reducing the axial temperature gradient deviation $\Delta G$. Therefore, the generation of defects due to the temperature difference between the central and circumferential parts of the single crystalline ingot 29 growing at a predetermined pulling rate is reduced. In addition, an interior of the third shielding part 41 is filled with a material having an excellent insulating property and becomes an adiabatic part 43 preventing heat from being transferred to the upper part of the ingot 29.

Unfortunately, the apparatus for growing a single crystalline ingot according to the related art only accumulates the heat near the growth interface between the third shielding part and the meltdown silicon by preventing the radiant heat radiated from the meltdown silicon from being transferred to the upper part of the chamber by the third shielding part of the thermal shield.

Therefore, a number of crystal defects are generated due to the large axial temperature gradient deviation ΔG in the radial direction of the crystal since the temperature hardly rises on account of the concentration failure of the accumulated heat at the circumferential part of the single crystalline ingot.

Moreover, the average axial temperature gradient is reduced at the growth interface as the heat radiation of the central part is inhibited by the heat accumulated at the upper part between the third shielding part and the meltdown silicon, thereby reducing the growth rate thereof.

SUMMARY OF THE INVENTION

Accordingly, the present invention is directed to an apparatus for growing a single crystalline ingot that substantially obviates one or more of the problems due to limitations and disadvantages of the related art.

The object of the present invention is to provide an apparatus for growing a single crystalline ingot that reduces the generation of growth defects by decreasing the difference between the axial temperature gradients of the central and circumferential parts of a growing single crystalline ingot.

Another object of the present invention is to provide an apparatus for growing a single crystalline ingot that enables improvement of the growing rate of a single crystalline ingot by increasing an average axial temperature gradient at the growth interface of a single crystalline ingot.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention comprises a chamber; a quartz crucible established in the chamber for growing a single crystalline ingot with a predetermined diameter D which is to be put in the quartz crucible; a crucible supporter wrapping the quartz crucible and fixed to a rotational axis; a cylindrical heater surrounding the crucible supporter; a thermos surrounding the cylindrical heater, the thermos preventing heat radiated from the heater from propagating into a wall of the chamber; and a thermal shield.

The thermal shield includes a first cylindrical shielding part installed between the single crystalline ingot and the crucible; a second flange type shielding part connected to an upper part of the first shielding part, the second shielding part fixed to the thermos; and a third shielding part connected to a lower part of the first shielding part, the third shielding part protruding in the direction of the single crystalline ingot.

The third shielding part further includes a first face having a first horizontal corresponding distance W1 and a first radius of curvature R1, the first face confronting the single crystalline ingot and the meltdown silicon; a second face having a second horizontal corresponding distance W2 and a second radius of curvature R2, the second face confronting the heater and the meltdown silicon in an opposite direction from the single crystalline ingot; a third face confronting a circumferential face of the single crystalline ingot; and a fourth face having a third radius of curvature R3, the fourth face confronting an upper part of the chamber.

In another aspect, the present invention comprises a chamber; a quartz crucible established in the chamber for growing a single crystalline ingot with a predetermined diameter D which is to be put in the quartz crucible; a crucible supporter wrapping the quartz crucible and fixed to a rotational axis; a cylindrical heater surrounding the crucible supporter; a thermos surrounding the cylindrical heater, the thermos preventing heat radiated from the heater from propagating into a wall of the chamber; and a thermal shield.

The thermal shield includes a first cylindrical shielding part installed between the single crystalline ingot and the crucible; a second flange type shielding part connected to an upper part of the first shielding part, the second shielding part fixed to the thermos; and a third shielding part connected to a lower part of the first shielding part, the third shielding part protruding in the direction of the single crystalline ingot.

The third shielding part further includes a first face having a first horizontal corresponding distance W1 and a first convex radius of curvature R1, the first face confronting the single crystalline ingot and the meltdown silicon; a second face having a second horizontal corresponding distance W2 and a second convex radius of curvature R2, the second face confronting the heater and the meltdown silicon to an opposite direction from the single crystalline ingot; a third face confronting a circumferential face of the single crystalline ingot; and a fourth face having a third concave radius of curvature R3, the fourth face confronting an upper part of the chamber.

In a further aspect, the present invention comprises a chamber; a quartz crucible established in the chamber for growing a single crystalline ingot with a predetermined diameter D which is to be put in the quartz crucible; a crucible supporter wrapping the quartz crucible and fixed to a rotational axis; a cylindrical heater surrounding the crucible supporter; a thermos surrounding the cylindrical heater, the thermos preventing heat radiated from the heater from propagating into a wall of the chamber; and a thermal shield.

The thermal shield includes a first cylindrical shielding part installed between the single crystalline ingot and the crucible; a second flange type shielding part connected to an upper part of the first shielding part, the second shielding part fixed to the thermos; and a third shielding part connected to a lower part of the first shielding part, the third shielding part protruding in the direction of the single crystalline ingot.

The third shielding part further includes a first face having a first horizontal corresponding distance W1 and a first concave radius of curvature R1, the first face confronting the single crystalline ingot and the meltdown silicon; a second face having a second horizontal corresponding distance W2 and a second convex radius of curvature R2, the second face confronting the heater and the meltdown silicon in an opposite direction from the single crystalline ingot; a third face confronting a circumferential face of the single crystalline ingot; and a fourth face having a third concave radius of curvature R3, the fourth face confronting an upper part of the chamber.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2:
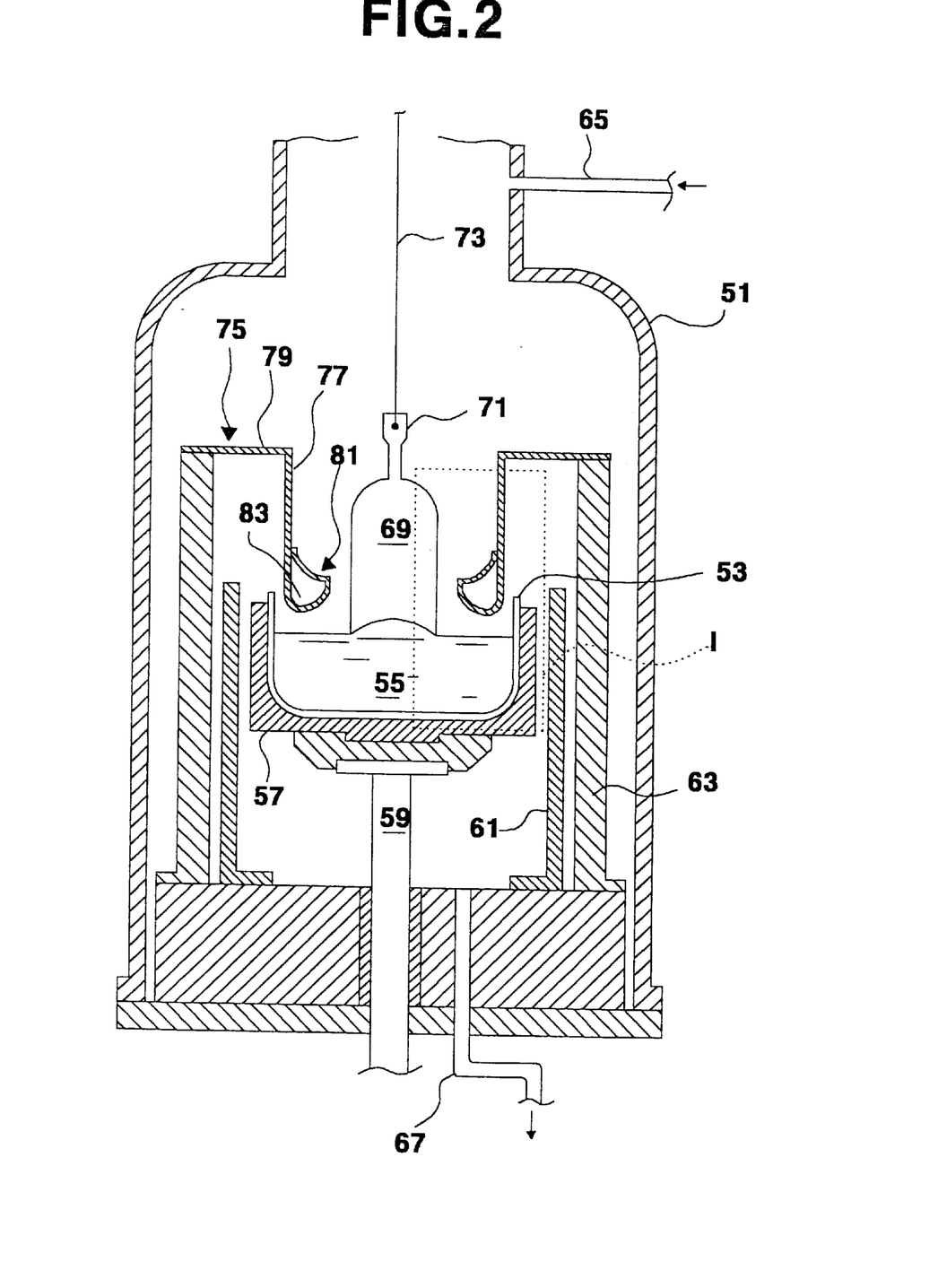
FIG. 2 shows a schematic cross-sectional view of an apparatus for growing a single crystalline ingot according to a first embodiment of the present invention.

FIG. 2 shows a schematic cross-sectional view of an apparatus for growing a single crystalline ingot according to the first embodiment of the present invention Referring to FIG. 2, a quartz crucible 53 in which a meltdown silicon 55 is put is installed in a chamber of the apparatus for growing the single crystalline ingot. The quartz crucible 53 is coated with a crucible supporter 57 having a surface made of graphite. The crucible supporter 57 is fixed to a rotational axis 59 which is rotated by a driving means (not shown in the drawing) so as to rotate the quartz crucible 53 to be driven upward.

The supporter 57 wrapping the quartz crucible 53 is surrounded at a predetermined interval by a cylindrical heater 61 which is surrounded by a thermos 63. In this case, the meltdown silicon 55 is provided by melting a polysilicon lump of high purity in the quartz crucible 53 using the heater 61. Hence, the thermos 63 prevents the heat radiated from the heater 61 from propagating to a wall of the chamber 51, thereby improving heat efficiency.

At the upper part of the chamber 51, a pulling means (not shown in the drawing) for pulling an object up by winding a cable 73 is installed, wherein the pulling means is rotational. At a lower part of the cable 73, a seed crystal 71 for growing a single crystalline ingot 69 by being pulled up while being contacted with the meltdown silicon 55 is set thereon. The pulling means winds to pull up the cable 73 with rotational movement when the single crystalline ingot 69 is being grown.

At the upper part of the chamber 51, a supply pipe 65 is established for supplying the growing single crystalline ingot 69 and the meltdown silicon 55 inside the crucible 53 with inert gas such as Ar, Ne, N or the like from the outside.

At the lower part of the chamber 51, an exhaust pipe 67 is installed for exhausting the used inert gas.

Then, a thermal shield 75 made of graphite coated with Mo, W, C or SiC is installed between the growing single crystalline ingot 69 and the crucible 53. In this case, the thermal shield 75 includes first, second and third shielding parts 77, 79 and 81 surrounding the single crystalline ingot 69.

The first shielding part 77 has a cylindrical shape which cuts off radiant heat from the heater 61 so as not to propagate heat into the ingot 69, the second shielding part 79 has a flange figure connected to an upper part of the first shielding part 77 and is fixed to the thermos 63 to cut off the radiant heat from the heater 61 so as not to propagate heat into the upper part of the chamber 51, and the third shielding part 81 is connected to a lower part of the first shielding part 77 and protrudes toward the single crystalline ingot 69.

Figure 3:
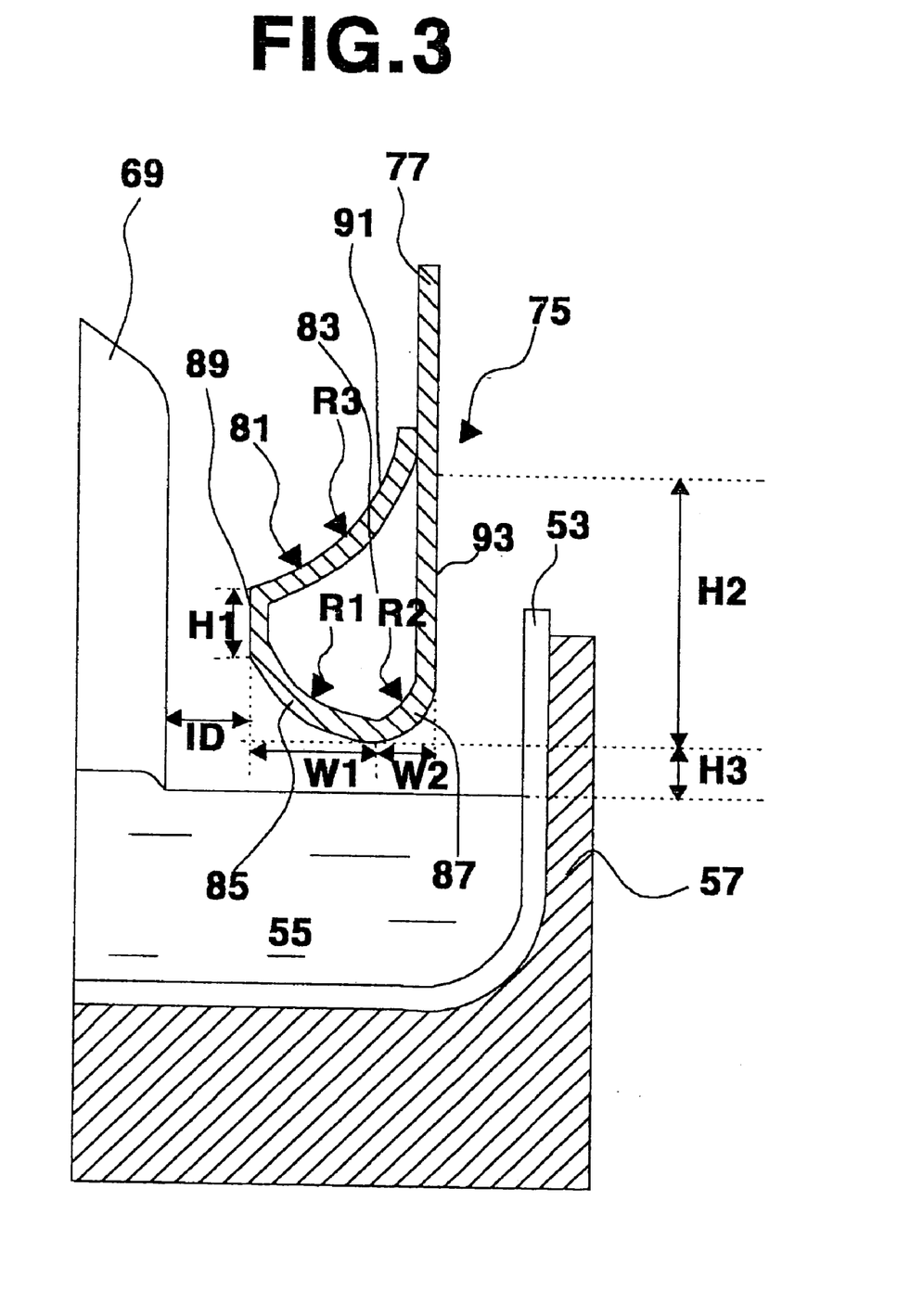
FIG. 3 shows a magnified cross-sectional view of a thermal shield illustrated in I of FIG. 2 in an apparatus for growing a single crystalline ingot according to the first embodiment of the present invention.
Figure 4:
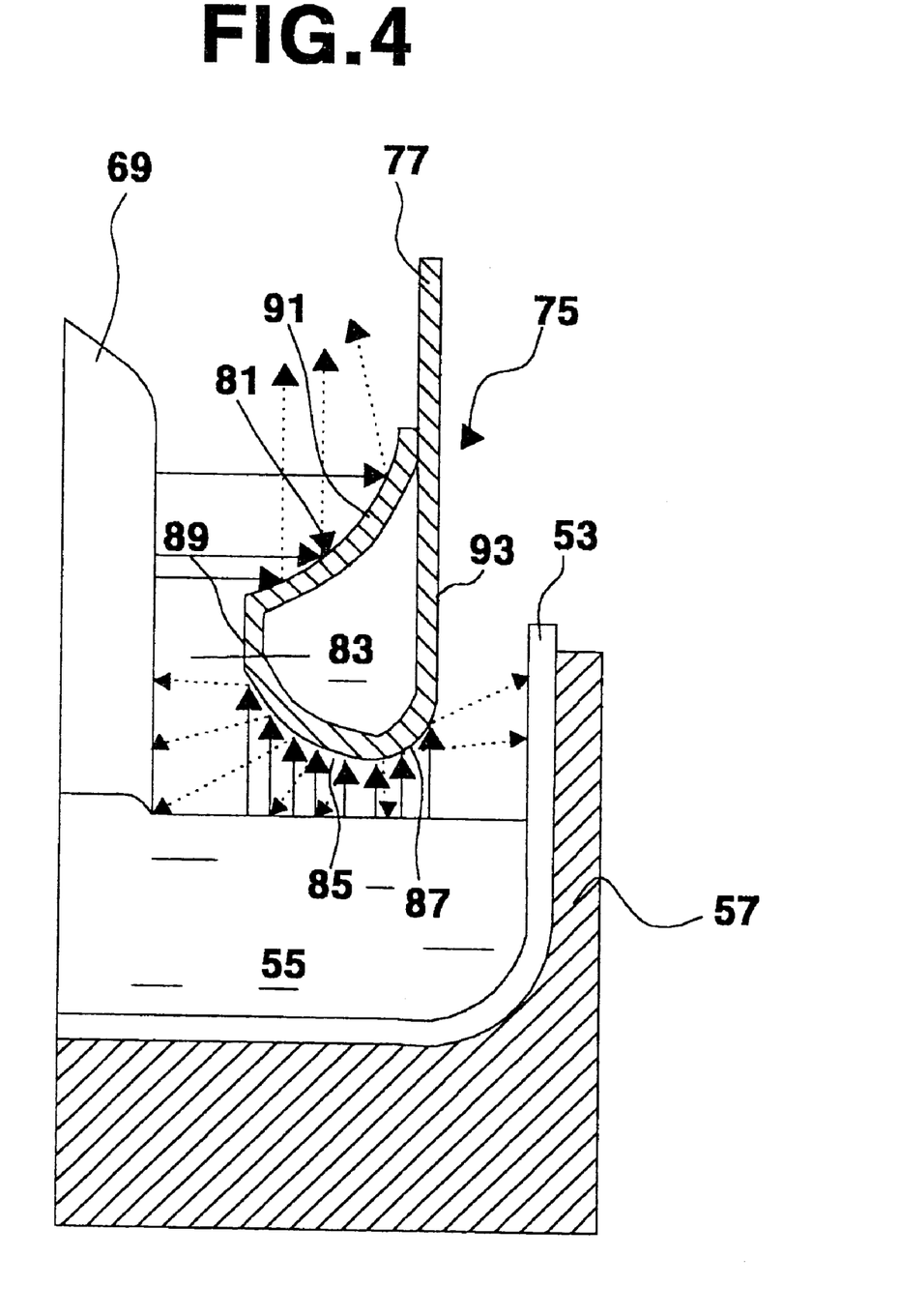
FIG. 4 shows an operation of the thermal shield shown in FIG. 3.

FIG. 3 shows a magnified cross-sectional view of a thermal shield illustrated in I of FIG. 2 in an apparatus for growing a single crystalline ingot according to the first embodiment of the present invention, and FIG. 4 shows an operation of the thermal shield shown in FIG. 3.

Referring to FIG. 3, the third shielding part 81 of the thermal shield 75 includes a first convex face 85 confronting the single crystalline ingot 69 and the meltdown silicon 55, a second face 87 which is convex and confronts the heater 61 and the meltdown silicon 55, a third face 89 which is flat and confronts a circumferential surface of the single crystalline ingot 69, and a fourth face 91 which is concave and confronts the upper part of the chamber 51. An interior part of the third shielding part 81 is filled with an insulating material, such as a carbon felt and the like, having an excellent insulating property, and becomes an adiabatic part 83 preventing heat from being transferred to the upper part of the ingot 69.

The third face of the third shielding part 81 is separated from the single crystalline ingot 69 by an interval ID. In this case, the interval ID is longer than 10 mm so as to prevent a collision between the third shielding part 81 and the single crystalline ingot 69 during the process, but should be shorter than 30 mm to prevent the radiant heat of the meltdown silicon 55 from propagating into the upper part of the single crystalline ingot 69. Namely, the interval ID should fall within the range 10 mm$\leq$ID$\leq$3 mm.

If a diameter of the single crystalline ingot 69 is 'D', a height H1 of the third face 89 lies in the range 0.05 D$\leq$H1$\leq$0.35 D to prevent the overcooling of the circumferential part. The height H2 of the third shielding part 81 lies in the range 1.0 D$\leq$H2$\leq$2.0 D to prevent the transference of radiant heat from the meltdown silicon 55 to the upper part of the single crystalline ingot 69. Thus, the temperature difference between the upper and lower parts therein is enlarged by increasing the axial temperature gradient Gc of the central part. The height H3 between the meltdown silicon 55 and the third shielding part 81 is adjusted to lie between 30 mm and 100 mm so as to increase or decrease the radiant heat from the heater 61 to the single crystalline ingot 69.

The first and second 85 and 87 are convex and have horizontal corresponding distances W1 and W2 and radii of curvature R1 and R2, respectively. The fourth face 91 is concave and has a radius of curvature R3. The sum of the horizontal corresponding distances W1 and W2 of the first and second 85 and 87 results in 0.5 D$\leq$W1+W2$\leq$1.0 D, while a ratio of these distances is 1.0$\leq$W1/W2$\leq$4.0. Moreover, a ratio of the radii of curvature R1 and R2 of the first and second faces 85 and 87 lies in a range 1.0$\leq$R1/R2$\leq$3.0, and the radius of curvature of the fourth face 91 should lie in R3$\leq$2.0 R1.

Owing to the convex figure of first face 85, as shown in FIG. 4, the radiant heat of the meltdown silicon 55 is radially reflected on a crystal location centering around the growth interface of the single crystalline ingot and on a surface of the meltdown silicon 55. Thus, the density of the radiant heat reaching the circumferential part of the single crystalline ingot 69 is dispersed so as to increase the temperature of the circumferential part without being excessive. Therefore, the axial temperature gradient Ge of the circumferential part is reduced properly, while the axial temperature gradient Gc of the central part increases properly.

The convex second face 87 reflects the radiant heat of the meltdown silicon 55 in the direction of the quartz crucible 53 and reduces the heat density between the meltdown silicon 55 and the third shielding part 81. Thus, the heat in the central part of the single crystalline ingot 69 is dissipated with ease so that the average axial temperature gradient at the growth interface is increased.

In this case, having the same radius of curvature, the first and second faces 85 and 87 may have the same central point.

The third face 89 reflects the heat dissipated from the single crystalline ingot 69 to improve the temperature of the circumferential part. The concave fourth face 91 reflects the heat dissipated from the upper part of the single crystalline ingot 69 to the upper part of the chamber 51 to prevent the heat from reflecting back on the upper part of the single crystalline silicon 69, thereby improving the average axial temperature gradient.

In this case, although the fourth face 91 has one radius of curvature R3, there may exist at least two multistep radii of curvature. If the fourth face 91 has multistep radii of curvature, a portion of the fourth face 91 adjacent to the single crystalline ingot 69 may have the same radius of curvature R3 as when having a single radius of the curvature only but have a larger radius of the curvature when becoming more distant from the ingot 69.

Therefore, the part of the fourth face 91 adjacent to the single crystalline ingot 69 reflects the heat dissipated from the upper part of the single crystalline ingot 69 to the upper part of the chamber 51 to prevent the heat from reflecting on the upper part of the single crystalline silicon 69, thereby improving the average axial temperature gradient. On the other hand, the part of the fourth face 91 having a larger radius of curvature when gradually becoming more distant from the ingot 69 also reflects the heat to be concentrated on a predetermined cooled-down part of the upper part of the single crystalline ingot 69, thereby removing crystal defects through additional heat treatment. The following 'Table 1' represents the change in the axial temperature gradient Gc at the crystal center and the axial temperature gradient deviation ΔG in the radial crystal direction when a single crystalline ingot is grown by the apparatus according to the present invention and the related art.

TABLE 1

|  | Gc(° K/cm) | ΔG(° K/cm) |
| --- | --- | --- |
| related art: | 22.01 | 0.83 |
| present invention: | 26.44 | 0.65 |

Referring to Table 1, the axial temperature gradient Gc at the central part of the crystal according to the apparatus of the related art has 22.01° K./cm, while that according to the apparatus of the present invention is improved to 26.44° K./cm so as to improve the growing rate and reduce the crystal defects.

Besides, the axial temperature gradient deviation Δ G in the radial crystal direction according to the apparatus of the related art is 0.83° K./cm, while that according to the apparatus of the present invention is reduced to 0.65° K./cm so as to decrease the deviation ΔG of the generation of crystal defects at a predetermined pulling rate compared to that of the related art.

The thermal shield 75 of the single crystalline ingot grown by the embodiment of the present invention reflects the radiant heat of the meltdown silicon 55 to the single crystalline ingot 69 by the first face 85, thereby increasing the temperature of the circumferential part. In addition, the thermal shield 75 according to the present invention increases the heat radiated to the single crystalline ingot 69 from the heater 61 by adjusting the height H3 between the meltdown silicon 55 and the third shielding part 81, thereby increasing the temperature of the circumferential part so as to reduce the axial temperature gradient Ge. Therefore, the present invention reduces the deviation of crystal defect generation by decreasing the axial temperature gradient deviation ΔG in the radial crystal direction of the single crystalline ingot.

Moreover, the third shielding part 81 prevents heat which is radiated from the meltdown silicon 55 from being transferred to the upper part of the single crystalline ingot 69. The second face 87 reflects the radiant heat of the meltdown silicon 55 in the direction of the quartz crucible 53 so as to reduce the heat density between the meltdown silicon 55 and the third shielding part 81. The fourth face 91 reflects the heat dissipated from the upper part of the single crystalline ingot 69 to the upper part of the chamber 51 so as to prevent back-reflection to the upper part of the single crystalline ingot 69.

Therefore, the present invention improves the axial temperature gradient at portions including the center of the crystal by increasing the temperature difference between the upper and lower parts of the single crystalline ingot 69, thereby improving the growth rate of the single crystalline ingot in which the generation of crystal defects is inhibited.

Figure 5:
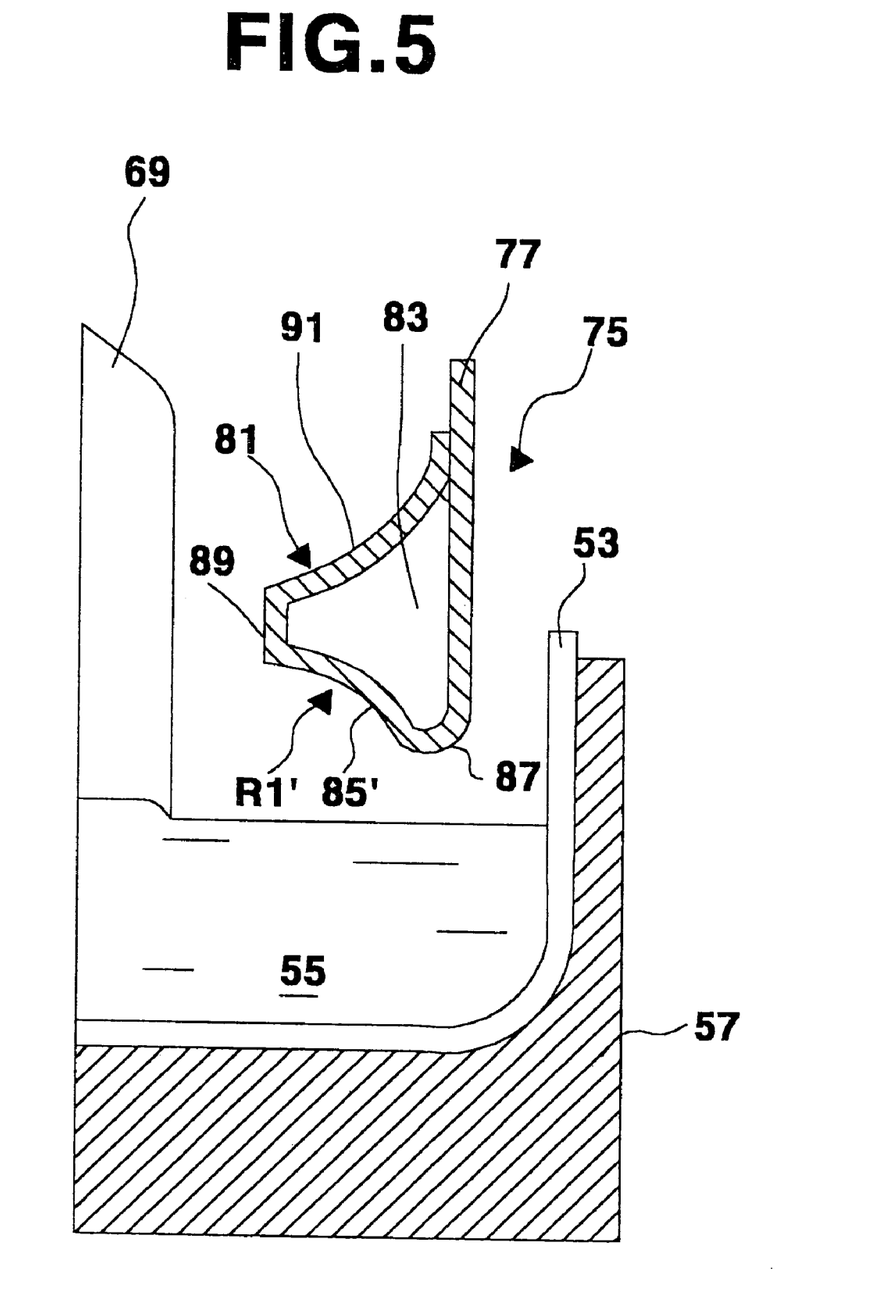
FIG. 5 shows a magnified cross-sectional view of a thermal shield according to a second embodiment of the present invention.
Figure 6:
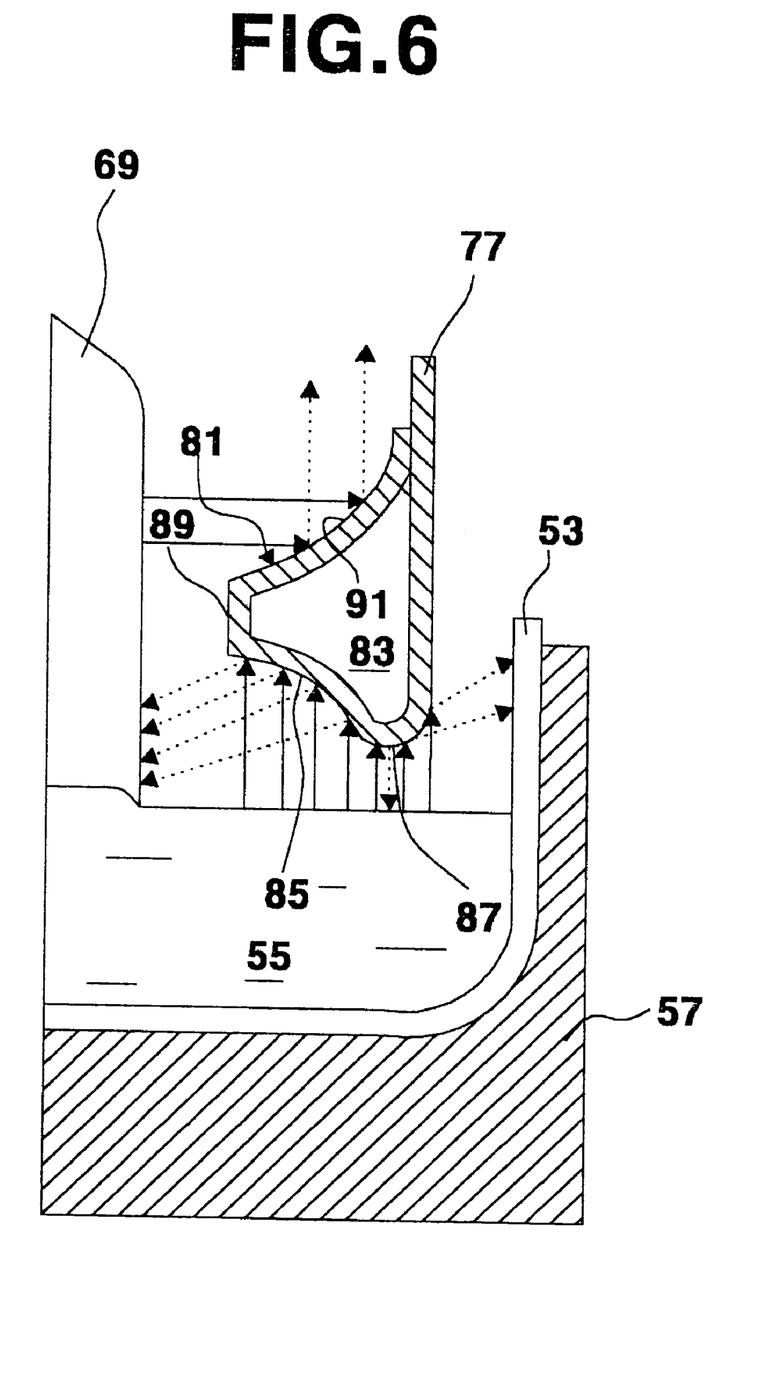
FIG. 6 shows an operation of the thermal shield illustrated in FIG. 5.

FIG. 5 shows a magnified cross-sectional view of a thermal shield 75 according to the second embodiment of the present invention, and FIG. 6 shows an operation of the thermal shield illustrated in FIG. 5.

The thermal shield 75 according to the second embodiment of the present invention has the same construction as that of the first embodiment of the present invention in FIG. 3 except for the first face 85' of the thermal shield 75, so that the same parts will be designated by the same numerals.

In the thermal shield 75 according to the second embodiment of the present invention, the first face 85' of the third shielding part 81 is opposite to the first embodiment of the present invention, having a concave figure with another radius of curvature R1'. In this case, the radius of curvature R1' of the first face 85' should lie in R1'≦1/2(R3).

The concave first face 85', as shown in FIG. 6, concentrates the reflected radiant heat of the meltdown silicon on the very top of the growth interface of the single crystalline ingot 69. Thus, the temperature of the circumferential part of the single crystalline ingot 69 increases so as to decrease the axial temperature gradient Ge thereon.

In the above case, the fourth face 91 may have at least two multi-step radii of curvature. A portion of the fourth face 91 adjacent to the single crystalline ingot 69, when having at least two multi-step radii of curvature, has the same radius of curvature R3 as the fourth face when having a single radius of curvature, but other portions of the fourth face 91 at increasing distances from the ingot 69 have larger radii of curvature.

Therefore, the present invention reduces the axial temperature gradient by increasing the temperature of the circumferential part of the single crystalline ingot by means of making the first face of the third shielding part reflect the radiant heat to the lower part of the single crystalline ingot and increasing the heat radiated from the heater to the single crystalline ingot by adjusting the height between the meltdown silicon and the third shielding part.

The present invention also decreases the heat density between the meltdown silicon and the third shielding part by preventing the radiant heat of the meltdown silicon from being transferred to the upper part of the single crystalline ingot by the third shielding part and having the second face reflect the radiant heat in the direction of the quartz crucible.

Further, the present invention improves the average axial temperature gradient by preventing the heat radiated from the upper part of the single crystalline ingot from being reflected back to the upper part of the single crystalline ingot through use of the fourth face.

Accordingly, the present invention enables reduction in the deviation of the generation of growth defects by decreasing the axial temperature gradient deviation ΔG in the radial crystal direction of the single crystalline ingot.

Moreover, the present invention enables an improved growth rate, restricting the generation of crystal defects, of the single crystalline ingot by improving the average axial temperature gradient.

It will be apparent to those skilled in the art that various modifications and variations can be made in an apparatus for growing a single crystalline ingot of the present invention without departing from the spirit or scope of the invention. Thus, it is intended that the present invention cover the modifications and variations of this invention provided they come within the scope of the appended claims and their equivalents.

What is claimed is:

1. An apparatus for growing a single crystalline ingot comprising:
   a chamber;
   a quartz crucible established in the chamber with a diameter D of a single crystalline ingot wherein a meltdown silicon is to be put in the quartz crucible;
   a crucible supporter wrapping the quartz crucible, the crucible supporter fixed to a rotational axis;
   a cylindrical heater surrounding the crucible supporter;
   a thermos surrounding the cylindrical heater, the thermos preventing heat radiated from the heater from propagating into a wall of the chamber;
   a thermal shield including:
     a first cylindrical shielding part installed between the single crystalline ingot and the crucible;
     a second shielding part connected to an upper part of the first shielding part, the second shielding part fixed to the thermos; and
     a third shielding part connected to a lower part of the first shielding part, the third shielding part protruding in a direction of the single crystalline ingot, the third shielding part further including:
       a first convex face having a first horizontal corresponding distance W1 and a first radius of curvature R1, the first face confronting the single crystalline ingot and the meltdown silicon;
       a second convex face having a second horizontal corresponding distance W2 and a second radius of curvature R2, the second face confronting the heater and the meltdown silicon in an opposite direction of the single crystalline ingot;
       a third face confronting a circumferential face of the single crystalline ingot; and
       a fourth face having a third radius of curvature R3, the fourth face confronting an upper part of the chamber.

2. The apparatus of claim 1, wherein the thermal shield is made of graphite coated with one of Mo, W, C and SiC.

3. The apparatus of claim 1, wherein the third shielding part further comprises an adiabatic part filled with carbon felt.

4. The apparatus of claim 1, wherein the third face of the third shielding part is established to be separated from the circumferential face of the single crystalline ingot by an interval of 1 mm to 30 mm.

5. The apparatus of claim 1, wherein a sum of the horizontal corresponding distances W1 and W2 lies in a range $0.5D \leq W1+W2 \leq 1.0D$.

6. The apparatus of claim 5, wherein a ratio of the horizontal corresponding distances W1 and W2 lies in a range $1.0 \leq W1/W2 < 4.0$.

7. The apparatus of claim 1, wherein a ratio of the radii of curvature R1 and R2 lies in range $1.0 \leq R1/R2 \leq 3.0$.

8. The apparatus of claim 7, wherein a central point of the first face coincides with a central point of the second face when the first and second radii of the first and second faces are substantially equal.

9. The apparatus of claim 1, wherein the fourth face is formed to be concave.

10. The apparatus of claim 9, wherein the fourth face has only one radius of curvature R3.

11. The apparatus of claim 10, wherein the radius of curvature R3 lies in $R3 \leq 2.0R1$.

12. The apparatus of claim 9, wherein the fourth face has a multi-step radii of curvature.

13. The apparatus of claim 12, wherein the multi-step radii of curvature increase with an increase in distance from a part adjacent to the circumferential face of the single crystalline ingot.

14. The apparatus of claim 13, wherein a ratio of the horizontal corresponding distances W1 and W2 of the first and second faces lies in a range $1.0 \leq W1/W2 \leq 4.0$.

15. The apparatus of claim 1, wherein the first face is concave and the second face is convex.

16. The apparatus of claim 15, wherein a sum of the horizontal corresponding distances W1 and W2 of the first and second faces lies in a range $0.5D \leq W1+W2 \leq 1.0D$.

17. The apparatus of claim 15, wherein a ratio of the radii of curvature R1 and R2 lies in a range $1.0 \leq R1/R2 \leq 3.0$.

18. The apparatus of claim 17, wherein a central point of the first face coincides with a central point of the second face when the first and second radii of the first and second faces are substantially equal.

19. The apparatus of claim 15, wherein the fourth face is formed to be concave.

20. The apparatus of claim 19, wherein the fourth face has one radius of curvature R3.

21. The apparatus of claim 20, wherein the radius of curvature R3 lies in $R3 \leq 2.0R1$.

22. The apparatus of claim 19, wherein the fourth face has multi-step radii of curvature.

23. The apparatus of claim 22, wherein the multi-step radii of curvature increase with an increase in distance from a part adjacent to the single crystalline ingot.

24. The apparatus of claim 1, wherein a height H1 of the third face lies in a range $0.05D \leq H1 \leq 0.35D$.

25. The apparatus of claim 1, wherein a height H2 of the third shielding part lies in a range $1.0D \leq H2 \leq 2.0D$.

26. The apparatus of claim 1, wherein a lowest bottom part of the third shielding part is 30 mm to 100 mm above a top of the meltdown silicon.

* * * * *